(12) United States Patent
Miyaguchi et al.

(10) Patent No.: US 6,864,629 B2
(45) Date of Patent: Mar. 8, 2005

(54) ORGANIC ELECTROLUMINESCENCE (EL) CELL THAT PREVENTS MOISTURE FROM DETERIORATING LIGHT-EMITTING CHARACTERISTICS AND A METHOD FOR PRODUCING THE SAME

(75) Inventors: Satoshi Miyaguchi, Saitama (JP); Hirofumi Kubota, Saitama (JP)

(73) Assignee: Pioneer Corporation, Tokyo-To (JP)

(*) Notice: Subject to any disclaimer, the term of this patent is extended or adjusted under 35 U.S.C. 154(b) by 0 days.

(21) Appl. No.: 09/493,121

(22) Filed: Jan. 28, 2000

(65) Prior Publication Data

US 2003/0164677 A1 Sep. 4, 2003

(30) Foreign Application Priority Data

Jan. 29, 1999 (JP) .............................. 11-021975

(51) Int. Cl.$^7$ ................................ H05B 33/00
(52) U.S. Cl. ...................................... 313/512
(58) Field of Search ................ 313/500–512; 445/24–25; 437/211; 428/690–691, 714

(56) References Cited

U.S. PATENT DOCUMENTS

| | | | | |
|---|---|---|---|---|
| 4,489,101 A | * | 12/1984 | Shibata | 427/39 |
| 5,124,204 A | * | 6/1992 | Yamashita et al. | 313/512 X |
| 5,189,405 A | * | 2/1993 | Yamashita et al. | 313/512 X |
| 5,686,360 A | * | 11/1997 | Harvey et al. | 438/28 |
| 5,811,177 A | * | 9/1998 | Shi et al. | 313/506 X |
| 5,952,778 A | * | 9/1999 | Haskal et al. | 313/504 |
| 6,198,217 B1 | * | 3/2001 | Suzuki et al. | 313/504 |

FOREIGN PATENT DOCUMENTS

| | | |
|---|---|---|
| JP | 8-111286 | 4/1996 |
| JP | 9-148066 | 6/1997 |
| JP | 10-144468 | 5/1998 |
| JP | 10-321375 | 12/1998 |

\* cited by examiner

*Primary Examiner*—Joseph Williams
(74) *Attorney, Agent, or Firm*—Morgan, Lewis & Bockius LLP

(57) ABSTRACT

An organic EL cell for preventing moisture that deteriorates the light-emitting characteristics of the organic EL cell including a substrate, a laminate structure formed on the substrate, wherein the laminate structure includes at least an anode, an organic light emitting layer, and a cathode, a first sealing film formed on the laminate structure, and a second sealing film formed on the first sealing film.

18 Claims, 4 Drawing Sheets

LIGHT EMITTING

LIGHT EMITTING

LIGHT EMITTING

LIGHT EMITTING

LIGHT EMITTING

LIGHT EMITTING

LIGHT EMITTING

ORGANIC ELECTROLUMINESCENCE (EL) CELL THAT PREVENTS MOISTURE FROM DETERIORATING LIGHT-EMITTING CHARACTERISTICS AND A METHOD FOR PRODUCING THE SAME

This application claims the benefit of Japanese patent application No. 11-21975, filed Jan. 29, 1999, which is hereby incorporated by reference.

BACKGROUND OF THE INVENTION

1. Field of the Invention

The present invention relates to an organic electroluminescence (EL) cell and to a method for producing the same. More particularly, the present invention relates to an organic EL cell that retains its stable light-emitting characteristics over a long period of time and to a method for producing such an organic EL cell.

2. Description of the Related Art

The structure of a conventional organic EL cell is shown in FIG. 4. The organic EL cell includes a substrate 1 that is transparent to light and a laminate structure 8 that is formed over the substrate 1. The laminate structure 8 includes an anode 2, a hole injecting layer 3 that is made of an organic compound, a hole transporting layer 4, a light emitting layer 5, an electron injecting layer 6, and a cathode 7, all of which are formed over one another as shown in FIG. 4.

The substrate 1 is made of, for example, a transparent glass, quartz, sapphire, or an organic film. The anode 2 is made of, for example, indium tin oxide (ITO). The cathode 7 is made of a highly reactive alloy composed mainly of an alkali metal or an alkaline earth metal, which is capable of electron emission at a low energy level.

The disadvantage of the organic EL cell shown in FIG. 4 is that the laminate structure 8 is exposed to the atmosphere. As a result, the cathode 7 of the laminate structure 8 is subject to oxidation by the moisture contained in the atmosphere. This oxidation by the moisture leads to deterioration in the light-emitting characteristics of the organic EL cell.

Several arrangements have been contemplated to overcome this disadvantage. For example, Japanese Patent Laid-Open Application No. 09-148066 discloses the sealing of the laminate structure 8 in an airtight container 10, which holds a desiccant 9, as shown in FIG. 5A.

A second arrangement is disclosed in Japanese Patent Laid-Open Application No. 08-111286. The second arrangement suggests covering the surface of the laminate structure 8 with a protective film 11, which is made of $SiO_2$ or $Si_3N_4$, as shown in FIG. 5B. Still, a third arrangement disclosed in Japanese Patent Laid-Open Application No. 10-144468 suggests covering the surface of the laminate structure 8 with a resin film for isolation from the atmosphere.

Each arrangement has a respective drawback. The first one increases the thickness and the weight of the EL cell. The second one needs a thick protective film and consequently, increases residual stress and takes a longer time for its formation. The residual stress may cause warpage and crack the substrate and thus, degrade characteristic properties of the EL cell. Moreover, the protective film has to be thick enough to protect the EL cell from damage during the manufacture process or the repair process, which includes a step of burning or opening a defective cell with a laser beam. Finally, the third arrangement is incomplete in preventing the cell from moisture.

SUMMARY OF THE INVENTION

Accordingly, the present invention is directed to an organic EL cell that substantially obviates one or more of the problems due to limitations and disadvantages of the related art.

An object of the present invention is to provide an organic EL cell and a method for producing the same such that the EL cell is protected from moisture that is detrimental to its light-emitting characteristics.

Additional features and advantages of the invention will be set forth in the description which follows, and will be apparent from the description, or may be learned by practice of the invention. The objects and other advantages of the invention will be realized and attained by the structure particularly pointed out in the written description and claims hereof as well as the appended drawings.

In a first aspect and to achieve these and other advantages in accordance with the purpose of the invention, as embodied and broadly described herein, an organic EL cell for preventing moisture that deteriorates the light-emitting characteristics of the organic EL cell includes a substrate; a laminate structure formed on the substrate, wherein the laminate structure includes at least an anode, an organic light emitting layer, and a cathode; a first sealing film formed on the laminate structure; and a second sealing film formed on the first sealing film.

In a second aspect, the present invention provides a method for producing an organic EL cell for preventing moisture that deteriorates the light-emitting characteristics of the organic EL cell and that includes a substrate and a laminate structure formed on the substrate, wherein the laminate structure includes at least an anode, an organic light emitting layer, and a cathode, including the steps of forming a first sealing film on the laminate structure and forming a second sealing film on the first sealing film.

In a third aspect, the present invention provides an organic EL cell having a substrate and a laminate structure thereon composed of at least an anode, an organic light-emitting layer, and a cathode, characterized in that the laminate structure has its surface sealed sequentially with an inorganic passivation film, which is formed by vapor deposition, and a resin film.

In a fourth aspect, the present invention provides an organic EL cell having, in addition to the features of the organic EL cell of the third aspect, a resin film that is coated with an inorganic passivation film formed by vapor deposition.

In a fifth aspect, the present invention provides an organic EL cell having a substrate and a laminate structure thereon composed of at least an anode, an organic light-emitting layer, and a cathode, characterized in that the laminate structure has its surface sealed sequentially with a resin film and an inorganic passivation film that is formed by vapor deposition.

In a sixth aspect, the present invention provides an organic EL cell having, in addition to the features of the organic EL cell of the fifth aspect, an inorganic passivation film that is coated with a resin film.

In a seventh aspect, the present invention provides an organic EL cell having, in addition to the features of the organic EL cells of any of the third through sixth aspects, an inorganic passivation film that is made of silicon nitride.

In an eight aspect, the present invention provides a method for production of an organic EL cell composed of a substrate and at least an anode, an organic light-emitting layer, and a cathode sequentially laminated thereon, including the steps of sealing the surface of the laminate structure sequentially with an inorganic passivation film, which is formed by vapor deposition and a resin film.

In a ninth aspect, the present invention provides a method including, in addition to the features of the method of the eighth aspect, the step of covering the resin film with an inorganic passivation film formed by vapor deposition.

In a tenth aspect, the present invention provides a method for production of an organic EL cell composed of a substrate and at least an anode, an organic light-emitting layer, and a cathode sequentially laminated thereon, including the steps of sealing the surface of the laminate structure sequentially with a resin film and an inorganic passivation film, which is formed by vapor deposition.

In an eleventh aspect, the present invention provides a method including, in addition to the features of the method of the tenth aspect, the step of covering the inorganic passivation film with a resin film.

In a twelfth aspect, the present invention provides a method having, in addition to the features of the method of the eleventh aspect, an inorganic passivation film that is made of silicon nitride and formed by plasma CVD.

In a thirteenth aspect, the present invention provides a method having, in addition to the features of the method of the twelfth aspect, a silicon nitride film that is formed by plasma CVD from a raw material gas composed only of silane and nitrogen.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
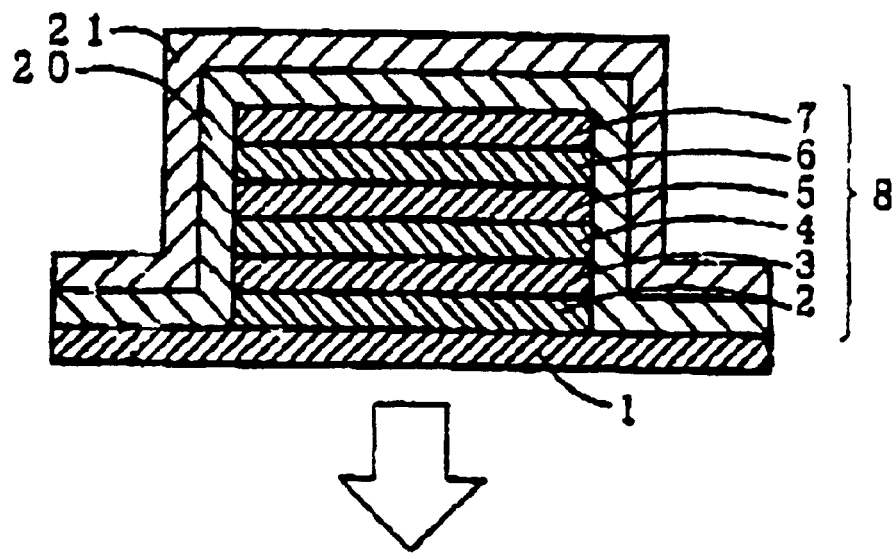
FIG. 1 is a sectional view of an organic EL cell in accordance with a first embodiment of the present invention.
Figure 4:
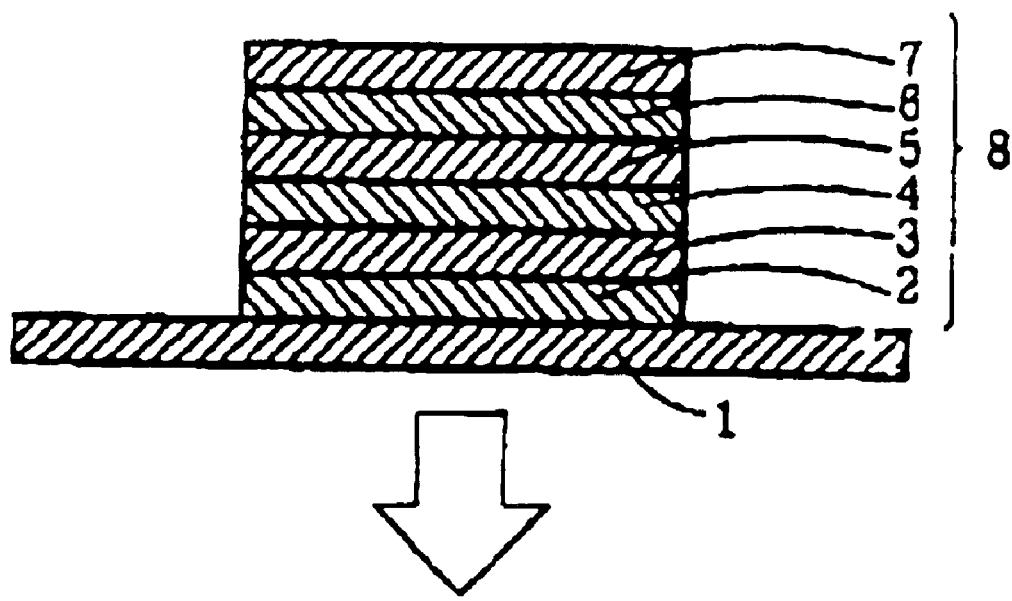
FIG. 4 is a sectional view showing a conventional organic EL cell.
Figure 5A:
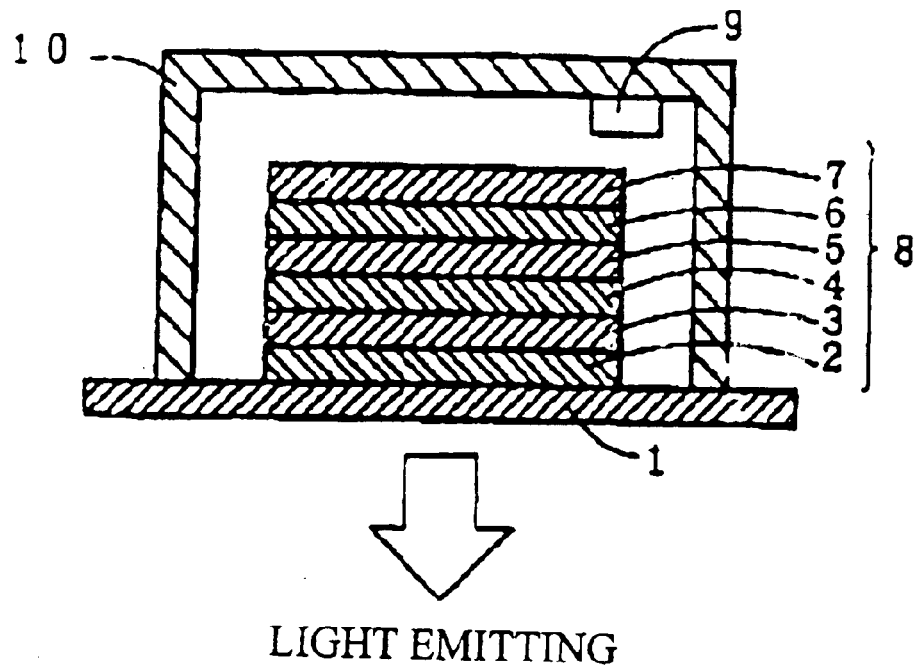
FIGS. 5A and 5B are sectional views of arrangements that have been contemplated to overcome the disadvantages of the organic EL cell shown in FIG. 4.
Figure 5B:
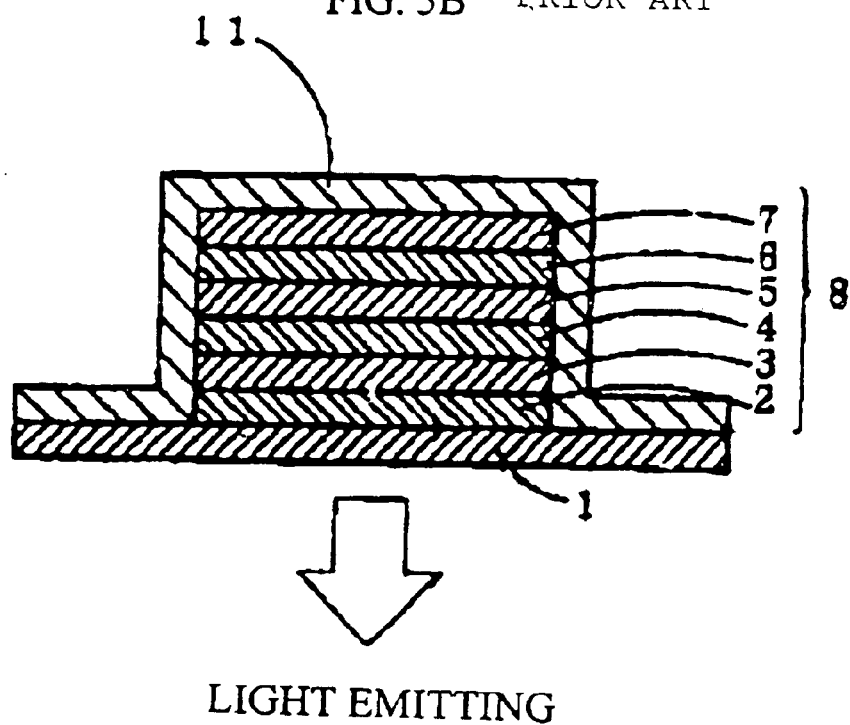

A first embodiment of the present invention will be explained now by referring to FIG. 1, which shows a sectional view of an organic EL cell. As shown in FIG. 1, the organic EL cell includes a substrate 1 and a laminate structure 8. The laminate structure 8 includes an anode 2, a hole injecting layer 3, a hole transporting layer 4, a light emitting layer 5, an electron injecting layer 6, and a cathode 7. The substrate 1 and the laminate structure 8 are similar to the substrate 1 and the laminate structure 8 shown in FIG. 4 and described in the foregoing description. However, in this first embodiment, the surface of the laminate structure 8 also is sequentially sealed with a film 20 made of silicon nitride ($SiN_x$) and a film 21 made of resin.

The method for producing the organic EL cell shown in FIG. 1 will now be described. A transparent substrate 1 undergoes vapor deposition to form a transparent anode 2 in conformity with an electrode pattern (not shown). The anode 2 is made of, for example, indium tin oxide (ITO). A hole injecting layer 3, a hole transporting layer 4, a light emitting layer 5, and an electron injecting layer 6 are formed sequentially on the anode 2 by vapor deposition. In one example, the hole injecting layer 3 is made of copper phthalocynaine, the hole transporting layer 4 is made of triphenylamine derivative (TPD), the light-emitting layer 5 is made of aluminum chelate complex ($Alq_3$), and an electron injecting layer 6 is made of lithium oxide ($Li_2O$). The cathode 7 is formed on the electron injecting layer 6 such that the pattern of the cathode 7 opposes the pattern of the anode 2. In one example, the cathode 7 is made of aluminum.

The resulting assembly that includes the glass substrate 1 and the laminate structure 8 that is formed on the glass substrate 1 is transferred into the chamber of a plasma chemical vapor deposition (CVD) without being exposed to the atmosphere. As a result, the resulting assembly has its surface sealed with a film 20, which is made of silicon nitride ($SiN_x$).

In this embodiment, plasma CVD was carried out by using a raw material gas composed only of silane ($SiH_4$) and nitrogen ($N_2$), with their flow rate controlled at 10 sccm and 200 sccm, respectively, in a chamber at 120° C. and 0.9 Torr and supplied with an RF power of 10 W. The resulting film was about 2 μm thick.

The sealing film 20, which is made of silicon nitride, was found to have a residual stress that was as small as $0.06 \times 10^9$ dyn/cm$^2$ immediately after film forming and $-0.17 \times 10^9$ dyn/cm$^2$ after a long time lapse. The plus value represents the compressive stress and the minus value represents the tensile stress. Moreover, the organic EL cell remained stable in its operation without the cracking or peeling of the sealing film 20 even after being exposed to a room temperature or a high temperature and high humidity. For example, the organic EL cell was stable in its operation and the sealing film 20 did not crack or peel even after being exposed to a temperature of 60° C. and a humidity of 95% RH for 500 hours.

The sealing film 20, which is made of silicon nitride 20 and formed by plasma CVD as mentioned in the foregoing description, is further sealed with a film 21 that is made of resin by spin coating or dipping. For example, the resin may be fluorocarbon resin or silicon resin.

In this first embodiment, the silicon nitride sealing film 20 prevents the cell from moisture and the resin sealing film 21 prevents scratches.

Figure 2:
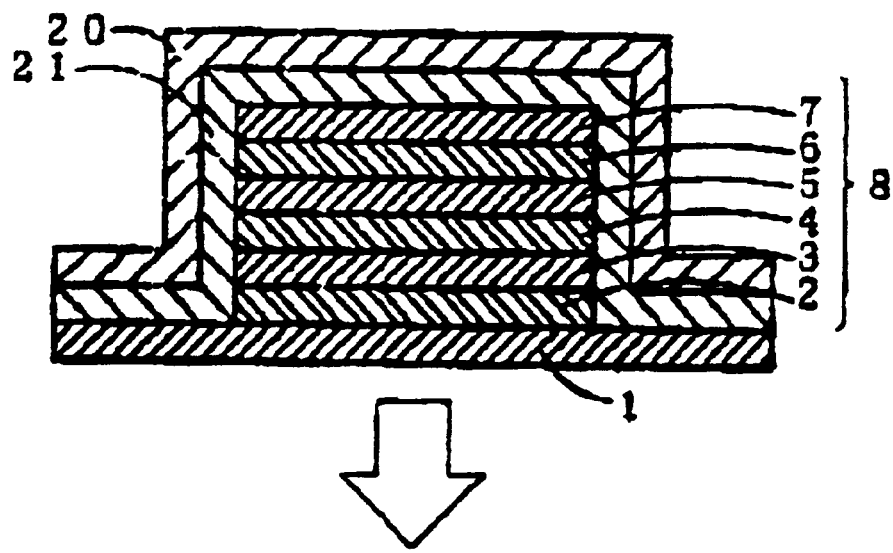
FIG. 2 is a sectional view of an organic EL cell in accordance with a second embodiment of the present invention.

A second embodiment of the present invention will now be explained by referring to FIG. 2. The organic EL cell shown in FIG. 2 is similar to the first embodiment shown in FIG. 1 with one substantial difference. The difference is that in the first embodiment, the laminate structure 8 in is sealed sequentially with a silicon nitride film 20 and a resin film 21, but in the second embodiment, the laminate structure 8 is sealed sequentially with a resin film 21 and a silicon nitride film 20. As a result of this difference, the second embodiment has an advantage over the first one in that the sealing film is less likely to be damaged by laser beams that might fluctuate in intensity when used to repair defective pixels.

The laser repair of defective pixels will be described now by referring to Japanese Publication No. 10-321375, which was also filed by the present applicant. This application discloses a method of treating defective pixels in the matrix display unit. Pixels on a line become less bright if there is a defective pixel in the line because the drive current concentrates in the defective pixel and decreases in the normal pixels. This method is designed to burn the defective pixel without breaking the electrode line by directing a laser beam at the defective pixel through the clear substrate. The laser repair needs accurate focusing. Accordingly, in the first embodiment, a laser beam that is out of focus may break the silicon nitride film, which is inferior in strength, resulting in a cell that is not fully protected against moisture. In the second embodiment, however, this is not true because a laser beam out of focus strikes the resin film, which is stronger, rather than the silicon nitride film.

The first embodiment also has advantages over the second one. As compared to the second embodiment, one advantage is that the outer resin film 21 of the first embodiment protects the silicon nitride film 20 from external shocks.

Figure 3A:
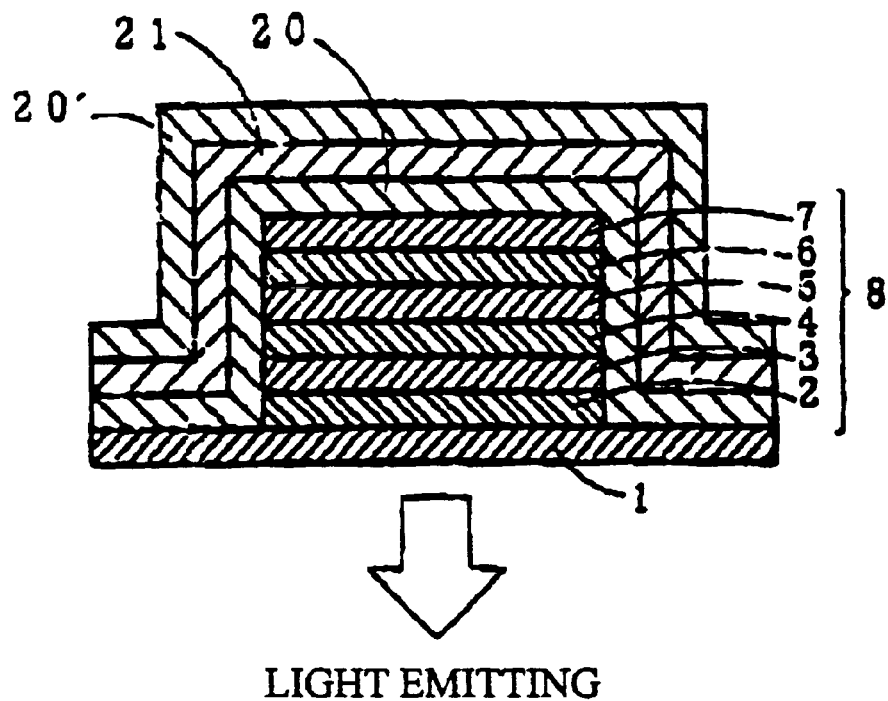
FIGS. 3A and 3B are sectional views of organic EL cells in accordance with a third and a fourth embodiment of the present invention.
Figure 3B:
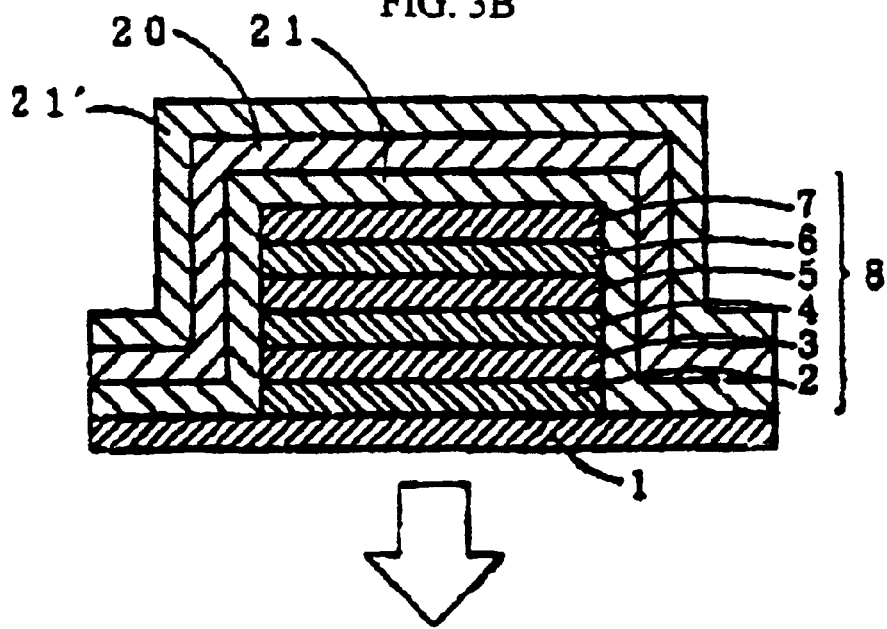

With reference to FIGS. 3A and 3B, the third and fourth embodiment of the present invention will be now described. The third embodiment shown in FIG. 3A is similar to the first embodiment shown in FIG. 1 with the exception of an additional silicon nitride sealing film 20' on the resin sealing film 21. The sealing film 20' is not limited to silicon nitride. For example, the sealing film 20' may be replaced by cover glass. Cover glass increases strength, but it cannot be applied to those cells formed on a flexible substrate.

The fourth embodiment shown in FIG. 3B is similar to FIG. 2 with the exception of an additional resin sealing film 21', which is formed on the silicon nitride sealing film 20. This resin sealing film 21' protects the silicon nitride sealing film 20 from external shocks.

The four embodiments are not limited to the foregoing description. For example, instead of using a silicon nitride film 20, which is formed by plasma CVD, to prevent the cell from moisture, any inorganic passivation film may be used. For example, instead of using silicon nitride, $SiO_2$, $Al_2O_3$, or diamond-like carbon (DLC) may be used. Moreover, the inorganic passivation film may be formed by sputtering or vacuum deposition.

The present invention provides an organic EL cell that has its laminate structure sealed sequentially with an inorganic passivation film or a silicon nitride film and a resin film. These sealing films have a low residual stress and fully protect the organic EL cell from moisture.

While the invention has been described in detail and with reference to specific embodiments thereof, it will be apparent to one skilled in the art that various changes and modifications can be made therein without departing from the spirit or scope thereof. Thus, it is intended that the present invention covers the modifications and variations of this invention provided they come within the scope of the appended claims and their equivalents.

What is claimed is:

1. An organic EL cell for preventing moisture that deteriorates the light-emitting characteristics of the organic EL cell, comprising:
    a substrate;
    a laminate structure formed on the substrate, wherein the laminate structure includes at least an anode, an organic light emitting layer, and a cathode;
    a first sealing film of an inorganic material formed on the cathode of the laminate structure;
    a second sealing film of an organic material formed on the first sealing film; and
    a third sealing film of an inorganic material formed on the second sealing film.

2. The organic EL cell of claim 1, wherein the first sealing film is an inorganic passivation film and the second sealing film is a resin film.

3. The organic EL cell of claim 1, wherein the third sealing film is an inorganic passivation film.

4. The organic EL cell of claim 3, wherein the first sealing film and the third sealing film are selected from a group consisting of silicon nitride, $SiO_2$, $Al_2O_3$, and diamond-like carbon (DLC).

5. The organic EL cell of claim 4, wherein the first sealing film and the third sealing film are formed by vapor deposition.

6. The organic EL cell of claim 4, wherein the first sealing film is formed directly on the cathode of the laminate structure.

7. The organic EL cell of claim 1, wherein the second sealing film is formed contacting the first sealing film, and wherein the third sealing film is formed contacting the second sealing film.

8. The organic EL cell of claim 7, wherein the first sealing film is formed contacting the entire surface of the laminate structure to passivate the cathode.

9. The organic EL cell of claim 1, wherein the first sealing film is formed directly on the cathode of the laminate structure.

10. A method for producing an organic EL cell for preventing moisture that deteriorates the light-emitting characteristics of the organic EL cell and that includes a substrate and a laminate structure formed on the substrate, wherein the laminate structure includes at least an anode, an organic light emitting layer, and a cathode, comprising the steps of forming a first sealing film of an inorganic material on the cathode of the laminate structure, forming a second sealing film of an organic material on the first sealing film, and forming a third sealing film of an inorganic material on the second sealing film.

11. The method of claim 10, wherein the first sealing film is an inorganic passivation film and the second sealing film is a resin film.

12. The method of claim 11, wherein the third sealing film is an inorganic passivation film.

13. The method of claim 12, wherein the first sealing film and the third sealing film are selected from a group consisting of silicon nitride, $SiO_2$, $Al_2O_3$, and diamond-like carbon (DLC).

14. The method of claim 13, wherein the first sealing film and the third sealing film are formed by vapor deposition.

15. The method of claim 13, wherein the inorganic passivation film is that of silicon nitride formed by a plasma CVD.

16. The method of claim 13, wherein the first sealing film is formed directly on the cathode of the laminate structure.

17. The method of claim 15, wherein the silicon nitride is formed by the plasma CVD from a raw material gas composed only of silane and nitrogen.

18. The method of claim 10, wherein the first sealing film is formed directly on the cathode of the laminate structure.

* * * * *